(12) United States Patent
Tsuchiya

(10) Patent No.: US 7,048,594 B2
(45) Date of Patent: May 23, 2006

(54) TERMINAL

(75) Inventor: Takashi Tsuchiya, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/855,225

(22) Filed: May 27, 2004

(65) Prior Publication Data

US 2004/0242082 A1    Dec. 2, 2004

(30) Foreign Application Priority Data

May 30, 2003   (JP) .............................. 2003-154260

(51) Int. Cl.
*H01R 13/42*   (2006.01)
(52) U.S. Cl. ........................................ 439/751; 439/82
(58) Field of Classification Search .............. 439/751, 439/82
See application file for complete search history.

(56) References Cited

U.S. PATENT DOCUMENTS

| | | | |
|---|---|---|---|
| 4,274,699 A | 6/1981 | Keim | ......................... 439/637 |
| 4,586,778 A * | 5/1986 | Walter et al. | ................ 439/825 |
| 5,055,072 A | 10/1991 | Shinoda | ....................... 439/751 |
| 6,139,373 A | 10/2000 | Ward et al. | .............. 439/733.1 |
| 2001/0000368 A1 | 4/2001 | Ward et al. | .................... 29/874 |

FOREIGN PATENT DOCUMENTS

| | | |
|---|---|---|
| DE | 4115676 | 11/1992 |
| JP | 58-123678 | 7/1983 |

* cited by examiner

*Primary Examiner*—Javaid H. Nasri
(74) *Attorney, Agent, or Firm*—Gerald E. Hespos; Anthony J. Casella

(57) ABSTRACT

A terminal (10) has two high-rigidity portions (14) for resiliently contacting the inner surface of a through hole (23). A low-rigidity portion (17) spans between the high-rigidity portions (14) and is compressively deformable along its spanning direction. The low-rigidity portion (17) has an easily breakable portion (19) that breaks when a stress acting during the insertion of the terminal (10) into the through hole (23) exceeds a resiliency limit. Thus, the terminal (10) is held resiliently in contact with a large diameter through hole (23) by resilient forces of the two high-rigidity portions (14) and a resilient force of the low-rigidity portion (17). However, the terminal (10) is held resiliently in contact with a small diameter through hole (23) only by the resilient forces of the two high-rigidity portions (14).

10 Claims, 6 Drawing Sheets

TERMINAL

BACKGROUND OF THE INVENTION

1. Field of the Invention

The invention relates to a terminal to be mounted on an electric or electronic device such as a circuit board.

2. Description of the Related Art

Press-fit terminals are inserted into through holes of a circuit board and are connected electrically with contact portions formed on the inner surfaces of the through holes without being soldered. Needle eye press-fit terminals are disclosed, for example, in Japanese Unexamined Patent Publication No. S58-123678 and U.S. Patent Application Publication No. 2001/0000368 A1 and have resiliently deformable contacts that bulge out arcuately to define a deformation space therebetween. The contacts deform resiliently in to close the deformation space as the terminal is inserted into a through hole of a circuit board. The resilient contacts press against the inner surface of the through hole and establish electrical connection with the contact portion of the through hole due to the resilient forces that act in directions to open the deformation space.

The resilient reaction forces of the resilient contacts typically are sufficient when the diameter of the through hoe is small. However, the resilient reaction forces of the resilient contacts may be insufficient when the diameter of the through hoe is large.

The present invention was developed in view of the above problem and an object thereof is to provide a terminal that can be used for a wide range of holes from those having smaller diameters to those having larger diameters.

SUMMARY OF THE INVENTION

The invention relates to a terminal for insertion into a hole of an electric or electronic device, such as a circuit board, to establish electrical connection with a contact portion on the inner surface of the hole. The terminal comprises at least one pair of high-rigidity portions formed to substantially face each other. Opposite longitudinal ends of the high-rigidity portions are coupled. The high-rigidity portions resiliently contact at least part of the inner surface of the hole. The terminal also comprises at least one low-rigidity portion that spans between the two high-rigidity portions and is compressively deformable substantially along its spanning direction. The low-rigidity portion has an easily breakable portion that breaks when a stress that acts during the insertion into the hole exceeds a resiliency limit.

The low-rigidity portion is deformed compressively and the high-rigidity portions are deformed resiliently in closing directions as the terminal is inserted into the through hole of the circuit board. The high-rigidity portions then are pressed against the inner surface of the through hole by a resilient force of the low-rigidity portion and resilient forces of the high-rigidity portions. Thus, an electrical connection with the contact portion is established and the terminal is prevented from coming out of the through hole. The high-rigidity portions are held resiliently in contact with at least part of the inner surface of the through hole by a sum of the resilient force of the low-rigidity portion and the resilient forces of the high-rigidity portions. Thus, a sufficient contact pressure is ensured and a highly reliable electrical connection is established with the contact portion even if the through hole has a large diameter.

The terminal is held resiliently in contact with a large diameter through hole by the sum of the resilient force of the low-rigidity portion and the resilient forces of the high-rigidity portions, as described above. On the other hand, the stress on the low-rigidity portion exceeds the resiliency limit when the terminal is inserted into a small diameter through hole and the easily breakable portion is broken. Thus, the terminal is held resiliently in contact with a small diameter through hole only by the resilient forces of the high-rigidity portions, since the resilient force of the low-rigidity portion disappears when the easily breakable portion is broken. Then, a terminal inserting force is reduced during insertion of the terminal into the through hole, and the terminal can be held resiliently in contact with the small diameter through hole at a suitable contact pressure attributable to the resilient forces of the high-rigidity portions. Therefore, the terminal can be used for through holes with a wide range of diameters.

The low-rigidity portion preferably has a smaller cross-section, and preferably is thinner than the high-rigidity portions. The low-rigidity portion may be formed unitarily or integrally with the high-rigidity portions. Thus, the low-rigidity portion can be produced and handled easily.

The easily breakable portion preferably is breakable when the diameter of the contact portion on the inner surface of the hole is smaller than a distance between opposite outer portions of the high-rigidity portions by about 5% to about 20%, more preferably by about 8% to about 17%.

The easily breakable portion preferably extends longitudinally from one end to the other end of the low-rigidity portion and/or extends laterally from one end to the other end of the low-rigidity portion.

Two split pieces preferably are formed in the low-rigidity portion at opposite sides of the easily breakable portion as the easily breakable portion is broken.

The outer surfaces of the high-rigidity portions preferably are formed into a substantially straight portion over an area more than ¼ and preferably over an area about ⅓ of the entire length of the high-rigidity portions.

The substantially straight portions preferably are substantially parallel with each other and are arranged substantially along an inserting direction ID of the terminal into the hole.

The substantially straight portions preferably have substantially arcuate surfaces along the inner surface of the through hole with respect to width direction.

The high-rigidity portions and the low-rigidity portion preferably are formed to be substantially point-symmetrical with respect to a radial middle point or axis of the terminal.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
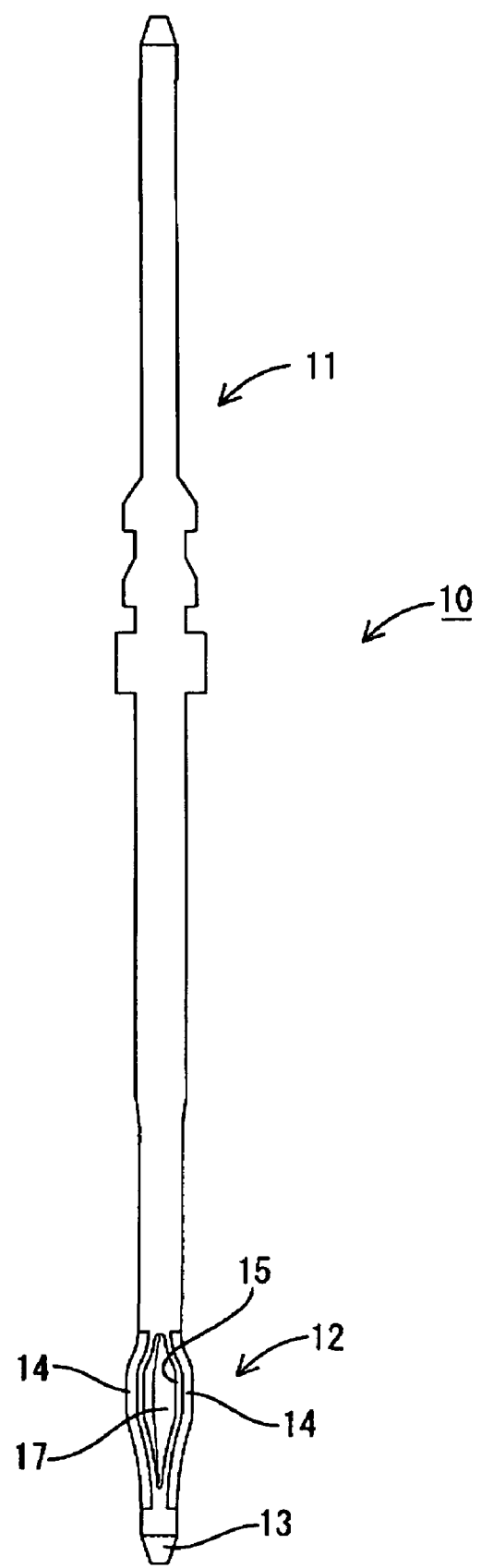
FIG. 1 is a front view of a terminal according to one embodiment of the invention.
Figure 2:
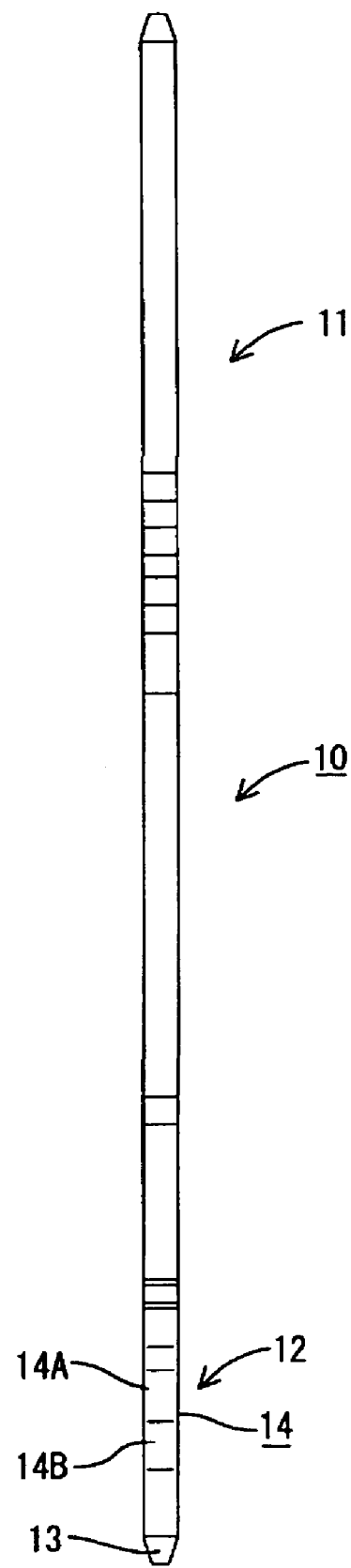
FIG. 2 is a side view of the terminal.

A press-fit terminal according to the invention is identified by the numeral 10 in FIGS. 1 to 7. The terminal 10 is a long narrow substantially rectangular bar formed by press-working a conductive (preferably metallic) wire or workpiece that has an excellent electrical conductivity. The press-working is carried out to bend the terminal 10 into an L-shape. The terminal 10 has a mounting portion 11 at one end and a board connecting portion 12 at the opposite end. The mounting portion 11 is configured for being pressed into an unillustrated circuit board connector. The board connecting portion 12 is configured for insertion in an inserting direction ID into a through hole 23 of a printed circuit board 20 or similar electric or electronic element.

Figure 3:
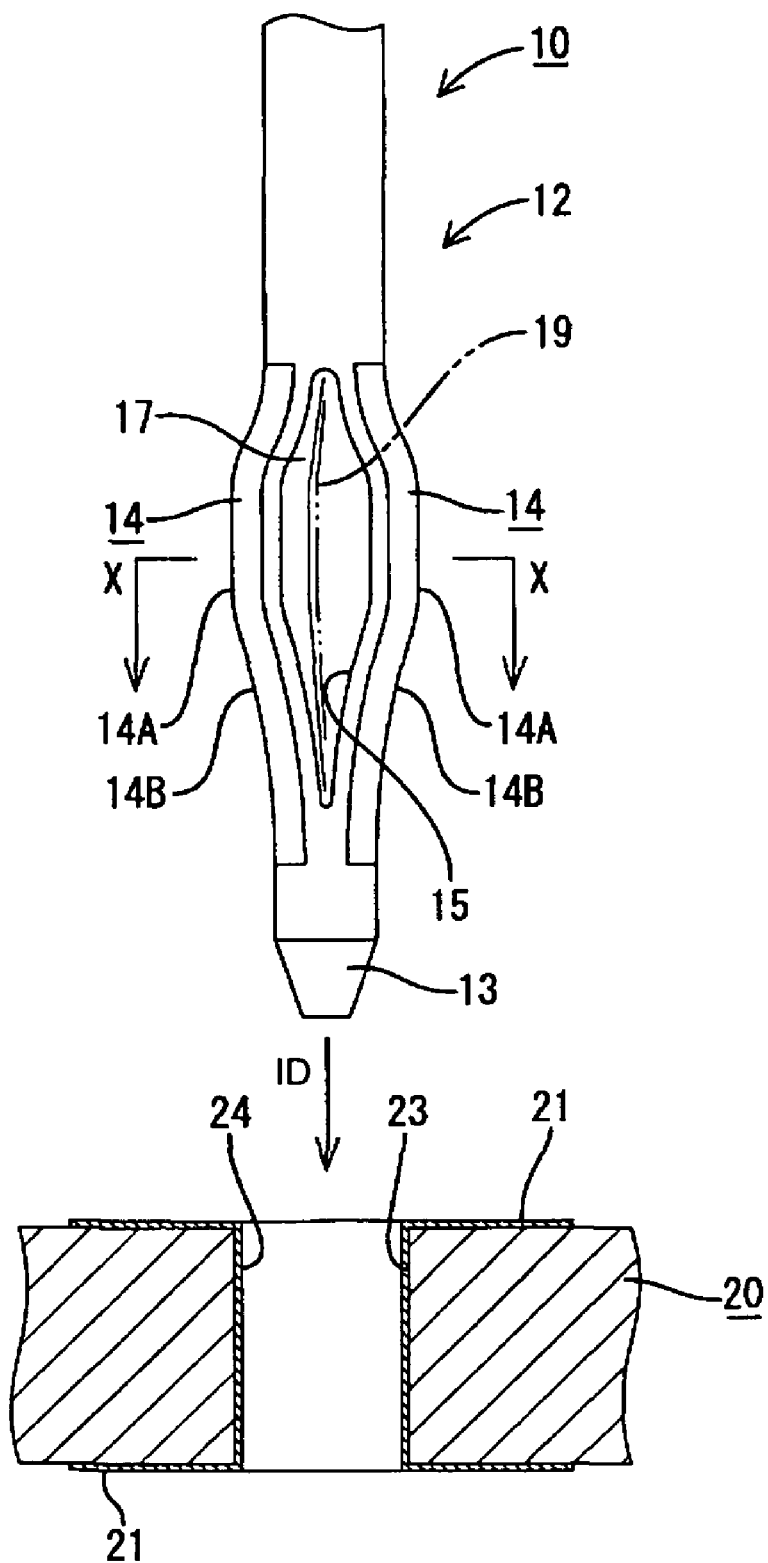
FIG. 3 is a front view partly in section showing an operation of inserting the terminal into a through hole of a printed circuit board.

As shown in FIG. 3, the printed circuit board 20 has at least one conductor path 21 formed in and/or on its outer surfaces and at least one through hole 23. A contact portion 24 is formed on the inner surface of each through hole 23 by plating and is connected with the conductor paths 21.

The board connecting portion 12, as shown in FIG. 3, has a tapered portion 13 formed at the leading end. Two high-rigidity portions 14 are formed behind the tapered portion 13, as seen in the inserting direction ID, and extend over an area that exceeds the depth of the through hole 23, preferably at least about twice the depth of the through hole 23. The high-rigidity portions 14 are thick strips that bulge radially outward in a substantially arcuate manner while defining a deformation space 15 therebetween. The outer surfaces of each high-rigidity portion 14 has a substantially straight portion 14A at a position slightly behind the longitudinal middle of the high-rigidity portions 14 and extends over an area more than ¼ of, and preferably an area about ⅓ of the entire length. The straight portions 14A are substantially parallel with each other and are arranged substantially along the inserting direction ID. The straight portions 14A have outer surfaces that extend arcuately in the width direction and substantially conform to the inner surface of the through hole 23. Specifically, both high-rigidity portions 14 have the opposite longitudinal ends 14', 14" coupled to each other and are resiliently deformable to open and close the deformation space 15 in substantially radial directions. The lateral portions 14', 14" are faces of the high-rigidity portions 14 facing substantially normal to the direction along which the high-rigidity portions 14 are deflected upon insertion into the through hole 23.

Figure 4:
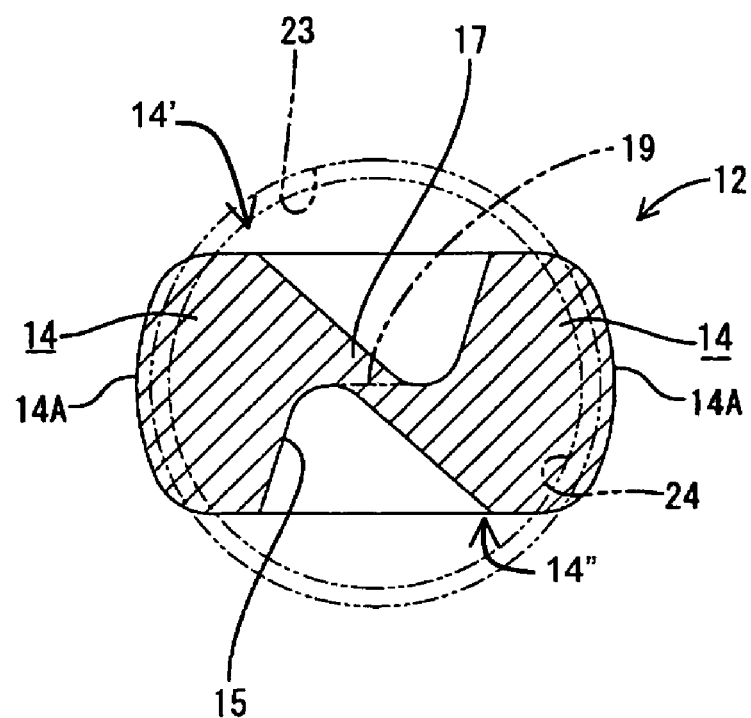
FIG. 4 is an enlarged section along 4—4 of FIG. 3.
Figure 5:
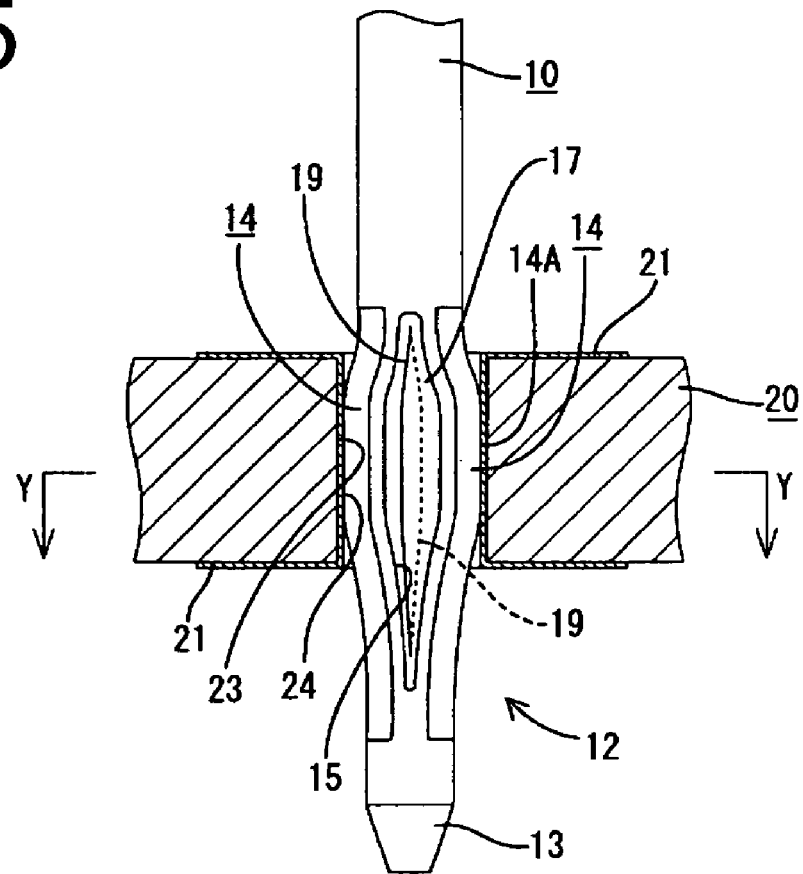
FIG. 5 is a front view partly in section showing a state when the terminal inserted into a through hole having a small diameter.

A low-rigidity portion 17 thinner or having a smaller cross section than the high-rigidity portions 14 is integrally or unitarily formed between the substantially facing inner surfaces of the high-rigidity portions 14. This low-rigidity portion 17 preferably is substantially plate-shaped and at least partly obliquely spans between the respective high-rigidity portions 14 in such a manner as to couple one widthwise edge (upper edge in FIG. 4) of one high-rigidity portion 14 and the other widthwise edge of the other high-rigidity portion 14 as shown in FIG. 4. Further, the low-rigidity portion 17 is so formed as to be thinner or smaller cross section in the intermediate position, preferably in middle with respect to its spanning direction and to be gradually thicker toward the opposite ends thereof coupled to the high-rigidity portions 14.

The two high-rigidity portions 14 and the low-rigidity portion 17 are formed to have a slightly flat Z- or N-shape as a whole, i.e. is substantially point-symmetrical (refer e.g. to FIG. 4). In other words, substantially opposite edge portions 14', 14" of the respective high-rigidity portions 14 are connected by the low-rigidity portion 17 extending substantially across the (imaginary) radial middle point (or longitudinal axis) of the terminal 10 while preferably first decreasing in thickness or cross-section towards the (imaginary) radial middle point and then increasing again so as to be preferably point-symmetrical with respect to the middle point (FIG. 4). Preferably the high-rigidity portions 14 have such a cross-section or shape and/or are made by such a material so as to have a rigidity which is more than about twice as high as the rigidity of the low-rigidity portion 17, the rigidity of the low-rigidity portion 17 being determined by its cross-section and/or material. Particularly, the force needed for deforming the high-rigidity portion(s) 14 is more than about twice as high as the force needed for deforming the low-rigidity portion 17.

Figure 6:
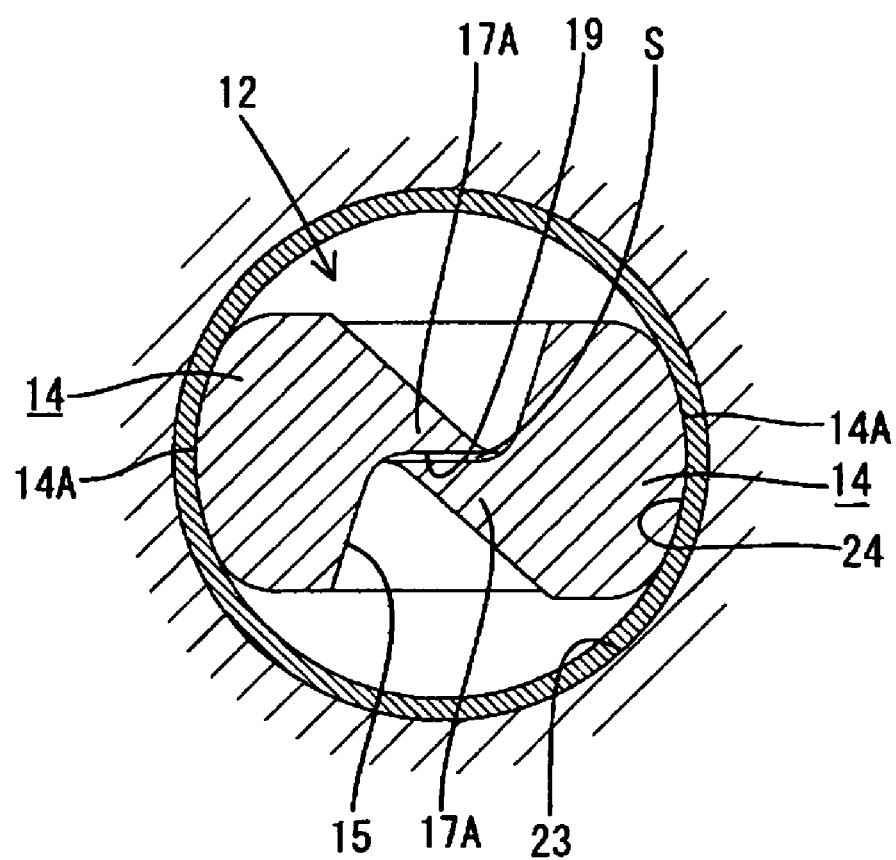
FIG. 6 is an enlarged section along 6—6 of FIG. 5.

The low-rigidity portion 17 is formed with an easily breakable portion 19 which is broken as a stress exceeds a specific resiliency limit when the board connecting portion 12 is inserted into the through hole 23 having a smaller diameter (preferably when the diameter of the contact portion 24 on the inner circumferential surface of the through hole 23 is smaller than a distance between the straight portions 14A of the two high-rigidity portions 14 by about 5 to about 20%). The easily breakable portion 19 extends longitudinally from the one end to the other end of the low-rigidity portion 17 and extends laterally or radially from the one end to the other end of the low-rigidity portion 17, as shown in FIG. 6. As the easily breakable portion 19 is broken, two split pieces 17A are formed in the low-rigidity portion 17 substantially at the opposite sides of the easily breakable portion 19.

The board connecting portion 12 of the terminal 10 is inserted in the inserting direction ID into the corresponding through hole 23 of the printed circuit board 20 as indicated by an arrow in FIG. 3. During the insertion, leading slanted portions 14B on the outer surfaces of the high-rigidity portions 14 contact the upper opening edge of the through hole 23. The slanted portions 14B of the high-rigidity portions 14 guide the terminal 10 into the through hole 23 and cause the high rigidity portions 14 to deform resiliently inward for at least partly closing the deformation space 15. Insertion is completed when the substantially straight portions 14A on the outer surfaces of the high-rigidity portions 14 reach an intermediate position of the through hole 23.

Figure 7:
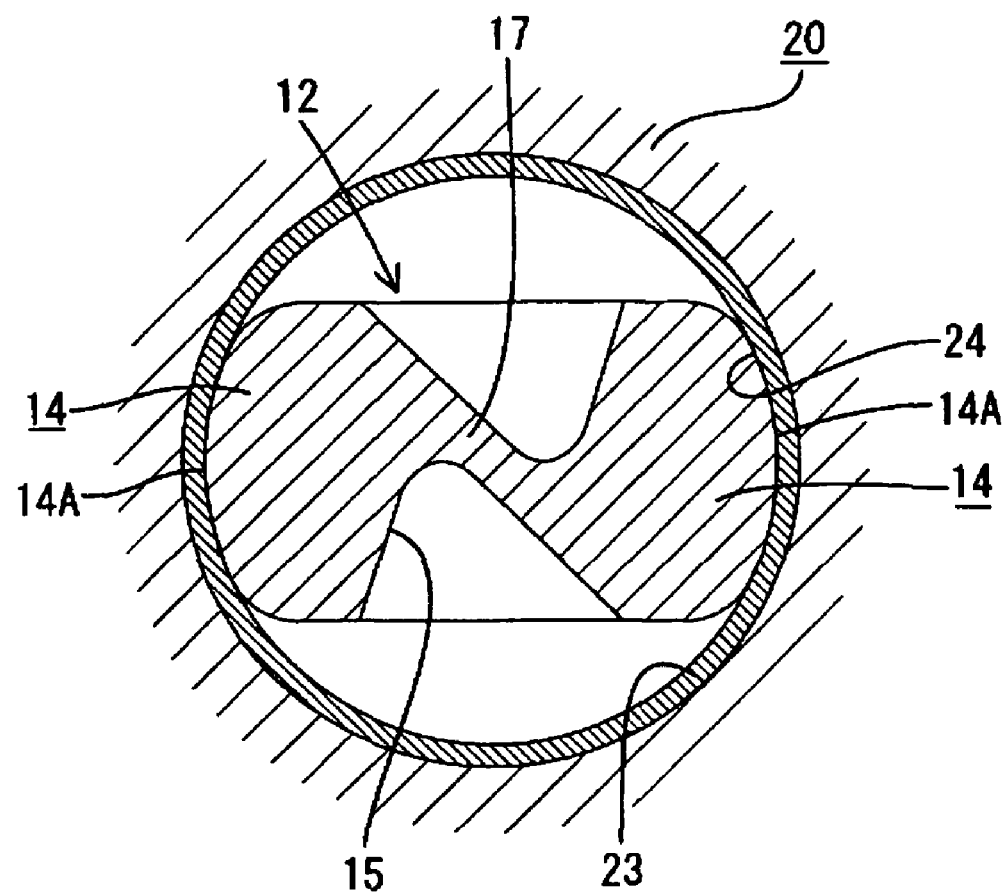
FIG. 7 is a diagram corresponding to FIG. 6 showing the terminal inserted into a through hole having a large diameter.

The low-rigidity portion 17 substantially maintains its state, but slightly deforms compressively along its spanning direction if the diameter of the through hole 23 is large, as shown in FIG. 7. Accordingly, the straight portions 14A on the outer surfaces of the two high-rigidity portions 14 are strongly pressed against the inner circumferential surface of the through hole 23 due to radially outward resilient forces of the low-rigidity portion 17 in its elongating direction and the resilient forces of the high-rigidity portions 14 in the opening directions.

Contrary to this, stress on the low-rigidity portion 17 during the insertion exceeds the specific resiliency limit and the easily breakable portion 19 is at least partly broken if the through hole 23 has a small diameter. Then, as shown in FIG. 6, the respective split pieces 17A at the opposite sides of the easily breakable portion 19 are displaced from each other toward the facing high-rigidity portions 14 along the easily breakable portion 19, and the leading ends thereof substantially contact the inner surfaces of the facing high-rigidity portions 14. In this state, a slight clearance S is defined between the substantially facing surfaces of the respective split pieces 17A. Thus, the substantially straight portions 14A on the outer surfaces of the two high-rigidity portions 14 are pressed against the inner circumferential surface of the small-diameter through hole 23 at a suitable contact pressure only by the resilient forces of the high-rigidity portions 14 in the opening directions without being assisted by the resilient force of the low-rigidity portion 17.

As described above, the terminal 10 can establish a highly reliable electrical connection with the contact portion 24 on the inner surface of the through hole 23 while ensuring a sufficient contact pressure regardless of whether the diameter of the through hole 23 is large or small.

Further, the terminal 10 is formed such that the easily breakable portion 19 is broken when the stress acting on the low-rigidity portion 17 during the insertion of the terminal 10 into the through hole 23 having a small diameter exceeds the specific resiliency limit. Thus, the terminal 10 is inserted into the through hole 23 with a terminal inserting force reduced. Thus, an operation burden during the insertion of the terminal is reduced.

The invention is not limited to the above described and illustrated embodiment. For example, the following embodiments are also embraced by the technical scope of the present invention as defined by the claims. Beside the following embodiments, various changes can be made without departing from the scope and spirit of the present invention as defined by the claims.

The shape and orientation of the low-rigidity portion can be arbitrarily set provided that the low-rigidity portion is formed with the easily breakable portion which is broken when the stress acting during the insertion into the through hole exceeds the resiliency limit.

A means for breaking the breakable portion is not limited to the thinning of the low-rigidity portion, and the low-rigidity portion may be made of an easily breakable material or a combination thereof.

The breakable portion may be formed, for example, by forming the low-rigidity portion with a slit extending substantially in a breaking direction.

Even though the terminal 10 has been described as being fittable into a through hole 23 in the printed circuit board 20, it should be understood that it may be used in connection with bottomed holes having a sufficient depth for an at least partial insertion of the terminal thereinto so as to establish an electric connection with the contact portion 24 of the bottomed hole 23.

The terminal has been described with reference to its insertion in a through hole on a printed circuit board. However, the terminal may be used for other electric or electronic devices having a bottomed or through hole for electric connection such as electric appliances, junction boxes, connectors, etc.

What is claimed is:

1. A terminal formed from a long rectangular metal piece having opposite substantially parallel and substantially planar first and second surfaces, the terminal being insertable into a substantially cylindrical hole of an electric or electronic device to establish electrical connection with a contact portion on an inner surface of the hole, the terminal comprising:

first and second opposed high-rigidity portion for resiliently contacting opposed inner surface regions of the hole, opposite longitudinal ends of the high-rigidity portions being coupled; and a low-rigidity portion spanning diagonally between the first high-rigidity portions at the first surface of the terminal and the second high-rigidity portion at the second surface of the terminal, the low-rigidity portion being compressively deformable along a direction extending between said first and second high rigidity portions for permitting said high-rigidity portions to move closer to one another, the low-rigidity portion having an easily breakable portion between the first and second high-rigidity portion, the easily breakable portion being breakable when a stress acting during the insertion into the hole exceeds a resiliency limit.

2. The terminal of claim 1, wherein the low-rigidity portion has a smaller cross-section than the high-rigidity portions.

3. The terminal of claim 2, wherein the low-rigidity portion is unitary with the high-rigidity portions.

4. The terminal of claim 3, wherein the easily breakable portion is breakable when a diameter of the contact portion on the inner surface of the hole is smaller than a distance between substantially opposite outer portions of the high-rigidity portions by about 5% to about 20%.

5. The terminal of claim 3, wherein the easily breakable portion extends longitudinally from one end to the other end of the low-rigidity portion and extends laterally from one end to the other end of the low-rigidity portion.

6. The terminal of claim 1, wherein as the easily breakable portion is broken, a pair of split pieces are formed in the low-rigidity portion at substantially opposite sides of the easily breakable portion.

7. The terminal of claim 1, wherein the outer surfaces of the high-rigidity portions each have a substantially straight portion that extends over an area more than ¼ of a length of the high-rigidity portions.

8. The terminal of claim 7, wherein the substantially straight portions are substantially parallel with each other and are arranged substantially along an inserting direction ID of the terminal into the hole.

9. The terminal of claim 8, wherein the substantially straight portions have substantially arcuate surfaces extending substantially along the inner surface of the through hole with respect to a width direction.

10. The terminal of claim 1, wherein the high-rigidity portions and the low-rigidity portion are substantially point-symmetrical with respect to a radial middle axis of the terminal.

* * * * *